United States Patent
Lee et al.

(10) Patent No.: US 10,573,698 B2
(45) Date of Patent: Feb. 25, 2020

(54) TRANSISTOR, ORGANIC LIGHT EMITTING DISPLAY HAVING THE SAME, AND METHOD OF MANUFACTURING ORGANIC LIGHT EMITTING DISPLAY

(71) Applicant: SAMSUNG DISPLAY CO., LTD., Yongin-si, Gyeonggi-do (KR)

(72) Inventors: Kyoungwon Lee, Gwangmyeong-si (KR); Yoonho Khang, Yongin-si (KR); Myounggeun Cha, Seoul (KR); Youngki Shin, Hwaseong-si (KR); Woonghee Jeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 988 days.

(21) Appl. No.: 14/919,666

(22) Filed: Oct. 21, 2015

(65) Prior Publication Data
US 2016/0148986 A1    May 26, 2016

(30) Foreign Application Priority Data
Nov. 26, 2014    (KR) .................. 10-2014-0166650

(51) Int. Cl.
*H01L 27/12*      (2006.01)
*H01L 27/105*     (2006.01)
(Continued)

(52) U.S. Cl.
CPC ....... *H01L 27/3262* (2013.01); *G09G 3/3233* (2013.01); *H01L 29/6675* (2013.01);
(Continued)

(58) Field of Classification Search
CPC ............ H01L 27/1255; H01L 27/3262; H01L 21/02532; H01L 27/1281; H01L 27/3265; H01L 21/02675; H01L 27/124
See application file for complete search history.

(56) References Cited

U.S. PATENT DOCUMENTS 5,612,234 A * 3/1997 Ha .................... H01L 29/66757
                                                257/E21.413
6,020,224 A * 2/2000 Shimogaichi ....... H01L 21/2026
                                                438/158

(Continued)

FOREIGN PATENT DOCUMENTS

JP        11-168217 A     6/1999
JP        2007-65015 A     3/2007
(Continued)

*Primary Examiner* — Bradley Smith
*Assistant Examiner* — David J Goodwin
(74) *Attorney, Agent, or Firm* — Lewis Roca Rothgerber Christie LLP

(57) ABSTRACT

A transistor including a polysilicon layer on a base substrate and including a channel region, a first ion doping region, a second ion doping region, the channel region being between the first and second ion doping regions, an average size of the grains in the channel region being greater than that of the grains in the first and second ion doping regions, a first gate electrode insulated from and overlapping the channel region, a second gate electrode insulated from the first gate electrode and overlapping the channel region, an inter-insulating layer on the second gate electrode, a source electrode on the inter-insulating layer and connected to the first ion doping region, and a drain electrode on the inter-insulating layer and connected to the second ion doping region.

11 Claims, 9 Drawing Sheets

(51) Int. Cl.
*H01L 27/32* (2006.01)
*H01L 29/786* (2006.01)
*G09G 3/3233* (2016.01)
*H01L 29/66* (2006.01)

(52) U.S. Cl.
CPC .. *H01L 29/78645* (2013.01); *H01L 29/78675* (2013.01); *H01L 29/78696* (2013.01); *G09G 2300/0842* (2013.01); *H01L 27/3265* (2013.01)

(56) References Cited

U.S. PATENT DOCUMENTS

| | | | |
|---|---|---|---|
| 8,198,666 B2 | 6/2012 | Asami et al. | |
| 8,426,859 B2 | 4/2013 | Kakinuma | |
| 8,878,186 B2 | 11/2014 | Ono | |
| 9,111,803 B2 * | 8/2015 | Oda | H01L 21/02532 |
| 9,673,267 B2 * | 6/2017 | Kim | H01L 27/3262 |
| 2009/0078940 A1 | 3/2009 | Afentakis et al. | |
| 2009/0121231 A1 * | 5/2009 | Kim | H01L 29/66757 257/64 |
| 2009/0289258 A1 * | 11/2009 | Kim | H01L 29/66765 257/66 |
| 2010/0163885 A1 * | 7/2010 | Park | H01L 21/02532 257/72 |
| 2011/0121720 A1 | 5/2011 | Pearce et al. | |
| 2013/0075766 A1 * | 3/2013 | Chang | H01L 27/1255 257/88 |
| 2013/0140573 A1 * | 6/2013 | Nakamura | H01L 21/02532 257/59 |
| 2015/0055047 A1 * | 2/2015 | Chang | H01L 27/3262 349/43 |
| 2015/0055051 A1 * | 2/2015 | Osawa | H01L 27/1225 349/48 |
| 2017/0236948 A1 * | 8/2017 | Mizumura | H01L 21/20 257/66 |

FOREIGN PATENT DOCUMENTS

| | | |
|---|---|---|
| JP | 2007-316510 A | 12/2007 |
| JP | 2008-033072 A | 2/2008 |
| JP | 2008-192688 A | 8/2008 |
| JP | 2009-81433 A | 4/2009 |
| JP | 2009-271188 A | 11/2009 |
| JP | 2010-219511 A | 9/2010 |
| JP | 2012-174862 A | 9/2012 |
| KR | 10-2003-0058150 A | 7/2003 |
| KR | 10-2013-0069048 A | 6/2013 |
| KR | 10-2014-0062369 A | 5/2014 |
| WO | WO 2013/080260 A1 | 6/2013 |

* cited by examiner

TRANSISTOR, ORGANIC LIGHT EMITTING DISPLAY HAVING THE SAME, AND METHOD OF MANUFACTURING ORGANIC LIGHT EMITTING DISPLAY

CROSS-REFERENCE TO RELATED APPLICATION

This patent application claims priority to and the benefit of Korean Patent Application No. 10-2014-0166650, filed on Nov. 26, 2014, the content of which is hereby incorporated by reference in its entirety.

BACKGROUND

1. Field

The present disclosure relates to a transistor, an organic light emitting display having the same, and a method of manufacturing the same.

2. Description of the Related Art

Various display devices used in various multimedia devices, such as television sets, mobile phones, tablet computers, navigation systems, game units, etc., have been developed. Among them, an organic light emitting display is widely used. The organic light emitting display is a self-emissive display device and has advantages such as wide viewing angle, superior contrast, fast response time, etc.

The organic light emitting display includes an organic light emitting device, a capacitor charged with a voltage corresponding to a data signal, and a transistor controlling a driving current flowing through the organic light emitting device to correspond to the voltage charged in the capacitor.

SUMMARY

Aspects of embodiments of the present invention are directed to a transistor used to control an organic light emitting device included in an organic light emitting display (by, e.g., controlling a driving current flowing through an organic light emitting device), an organic light emitting display including the transistor, and a method of manufacturing the organic light emitting display.

According to one or more embodiments of the present inventive concept, there is provided a transistor including: a polysilicon layer on a base substrate and including a channel region, a first ion doping region, a second ion doping region, the channel region being between the first and second ion doping regions, an average size of the grains in the channel region being greater than that of the grains in the first and second ion doping regions; a first gate electrode insulated from and overlapping the channel region; a second gate electrode insulated from the first gate electrode and overlapping the channel region; an inter-insulating layer on the second gate electrode; a source electrode on the inter-insulating layer and connected to the first ion doping region; and a drain electrode on the inter-insulating layer and connected to the second ion doping region.

In an embodiment, the grains have an average diameter in a range from about 30 micrometers to about 40 micrometers in a center portion of the polysilicon layer and have an average diameter in a range from about 10 micrometers to about 20 micrometers in an edge portion of the polysilicon layer.

In an embodiment, the second gate electrode covers the first gate electrode.

In an embodiment, the channel region includes a first channel region overlapping the first and second gate electrodes in a direction in which the first and second ion doping regions are connected to each other, and a second channel region overlapping the second gate electrode and not overlapped with the first gate electrode, and an average size of corresponding ones of the grains in the first channel region is greater than that of corresponding ones of the grains in the second channel region.

In an embodiment, the first and second gate electrodes define a capacitor charged with electric charges.

In an embodiment, the transistor further includes: a first gate insulating layer between the polysilicon layer and the first gate electrode; and a second gate insulating layer between the first gate electrode and the second gate electrode, wherein the first gate insulating layer has a thickness less than a thickness of the second gate insulating layer.

In an embodiment, the transistor further includes a buffer layer between the base substrate and the polysilicon layer.

According to one or more embodiments of the present inventive concept, there is provided an organic light emitting display including: a scan driver configured to apply gate signals to gate lines and to apply light emitting control signals to light emitting lines; a data driver configured to apply data signals to data lines; and an organic light emitting display panel including a plurality of pixels, each of the pixels including an organic light emitting device and a circuit part configured to control the organic light emitting device, the circuit part including a first transistor and a second transistor, the first transistor being configured to output a corresponding data signal applied to a corresponding data line of the data lines in response to a corresponding gate signal applied to a corresponding gate line of the gate lines, and the second transistor being configured to control a driving current flowing through the organic light emitting device, the second transistor including: a polysilicon layer on a base substrate and including a channel region, a first ion doping region, a second ion doping region, the channel region is being between the first and second ion doping regions, an average size of the grains in the channel region being greater than that of the grains in the first and second ion doping regions; a first gate electrode insulated from and overlapping the channel region; a second gate electrode insulated from the first gate electrode and overlapping the channel region; an inter-insulating layer on the second gate electrode; a source electrode on the inter-insulating layer and connected to the first ion doping region; and a drain electrode on the inter-insulating layer and connected to the second ion doping region.

In an embodiment, the grains have an average diameter in a range from about 30 micrometers to about 40 micrometers in a center portion of the polysilicon layer and have an average diameter in a range from about 10 micrometers to about 20 micrometers in an edge portion of the polysilicon layer.

In an embodiment, the second gate electrode covers the first gate electrode.

In an embodiment, the first and second gate electrodes define a capacitor charged with a voltage corresponding to the data signal provided from the first transistor.

In an embodiment, the organic light emitting display further includes a buffer layer between the base substrate and the polysilicon layer.

According to one or more embodiments of the present inventive concept, there is provided a method of manufacturing an organic light emitting display, including: forming an amorphous silicon layer, a first gate electrode insulated from and overlapping the amorphous silicon layer, and a second gate electrode insulated from and overlapping the first gate electrode on a base substrate; irradiating a laser to the amorphous silicon layer from a lower portion of the base substrate to form a polysilicon layer from the amorphous silicon layer; forming an inter-insulating layer on the second gate electrode; ion-doping a portion of the polysilicon layer using the second gate electrode as a mask to form a first ion doping region and a second ion doping region; forming a source electrode connected to the first ion doping region, and a drain electrode connected to the second ion doping region; and forming an organic light emitting device connected to the drain electrode.

In an embodiment, the second gate electrode covers the first gate electrode.

In an embodiment, the laser includes an excimer laser.

In an embodiment, the method further includes: forming a first gate insulating layer between the polysilicon layer and the first gate electrode; and forming a second gate insulating layer between the first gate electrode and the second gate electrode, wherein the first gate insulating layer has a thickness less than a thickness of the second gate insulating layer.

In an embodiment, the method further includes forming a buffer layer between the base substrate and the polysilicon layer.

According to the above, the temperature of the amorphous silicon layer after the laser is irradiated to the amorphous silicon layer drops faster when the first and second gate electrodes exist, than when the first and second gate electrodes do not exist. Accordingly, the average size of the grains included in the polysilicon layer formed from the amorphous silicon layer becomes large. In addition, the average size of the grains gradually decreases as the distance from the center portion of the polysilicon layer increases and as the distance from the edge portion of the polysilicon layer decreases. Therefore, the driving time of the transistor may be reduced (e.g., become fast).

In addition, the first and second gate electrodes included in the transistor define the capacitor charged with the voltage corresponding to the data signal. Thus, no area for a separate capacitor is required and the size of the opening portion is increased, thereby improving (e.g., increasing) the light emitting efficiency.

BRIEF DESCRIPTION OF THE DRAWINGS

The above and other aspects of the present disclosure will become readily apparent by reference to the following detailed description when considered in conjunction with the accompanying drawings wherein.

DETAILED DESCRIPTION

Figure 1:
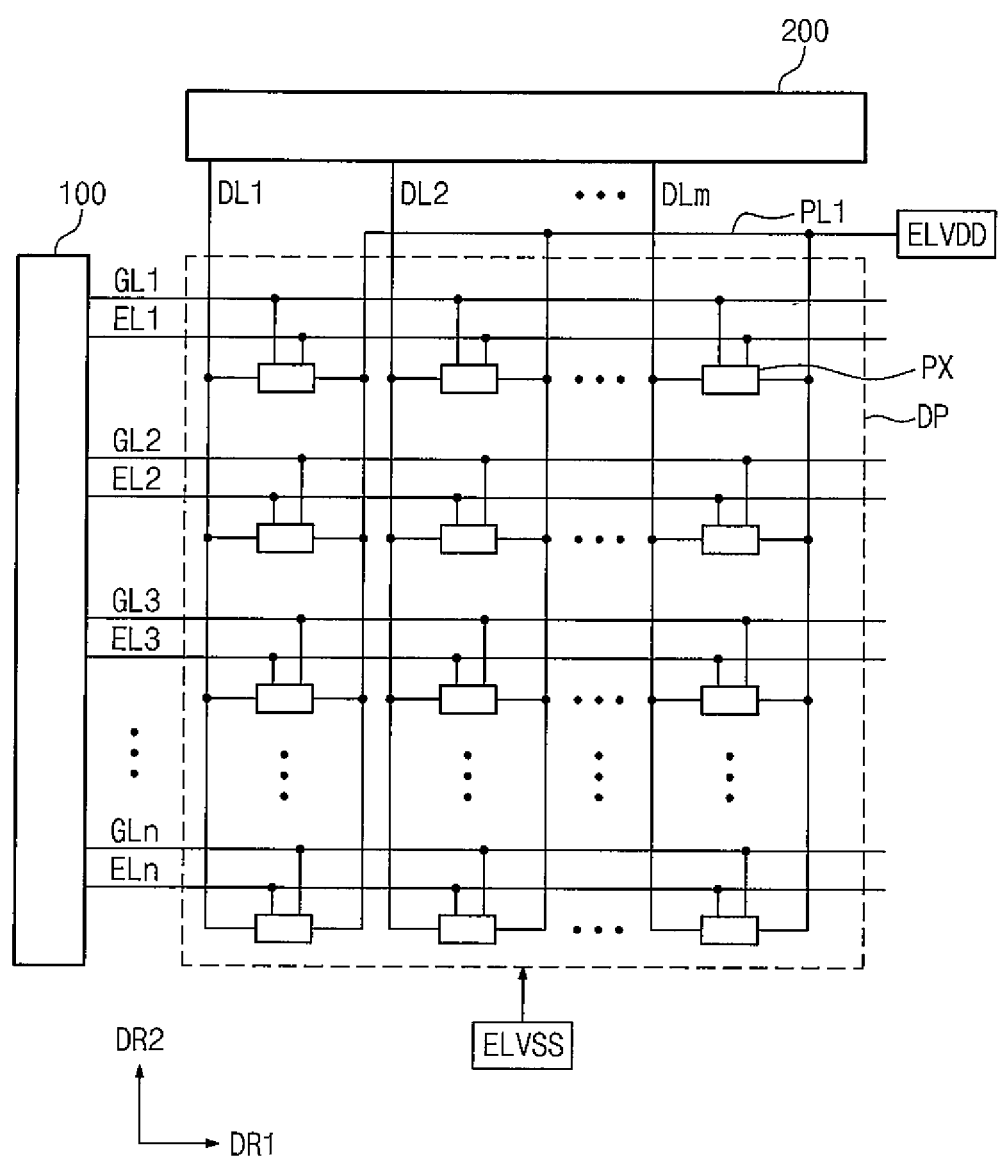
FIG. 1 is a block diagram showing an organic light emitting display according to an exemplary embodiment of the present disclosure.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, and 35 U.S.C. § 132(a).

The organic light emitting display and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the [device] may be formed on one integrated circuit (IC) chip or on separate IC chips. Further, the various components of the organic light emitting display may be implemented on a flexible printed circuit film, a tape carrier package (TCP), a printed circuit board (PCB), or formed on a same substrate. Further, the various components of the organic light emitting display may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a block diagram showing an organic light emitting display according to an exemplary embodiment of the present disclosure.

Referring to FIG. 1, the organic light emitting display includes a scan driver 100, a data driver 200, and a display panel DP.

The scan driver 100 receives a gate control signal from a timing controller. The gate control signal includes a vertical start signal to start an operation of the scan driver 100 and a clock signal to determine an output timing of signals. The scan driver 100 generates a plurality of gate signals and sequentially applies the gate signals to a plurality of gate lines GL1 to GLn described later. The scan driver 100 generates a plurality of light emitting control signals in response to the gate control signal and applies the light emitting control signals to a plurality of light emitting lines EL1 to ELn to be described later.

As shown in FIG. 1, the gate signals and the light emitting control signals are output from one scan driver 100, however, the number of the scan driver may not be limited to one. That is, the scan driver may be provided in a plural number, and the gate signals and the light emitting control signals may be output from the scan drivers. In addition, a driving circuit to generate the gate signals may be separately prepared from a driving circuit to generate the light emitting control signals.

The data driver 200 receives a data control signal and image data from the timing controller. The data driver 200 converts the image data to data signals and applies the data signals to a plurality of data lines DL1 to DLm insulated from the gate lines GL1 to GLn while crossing the gate lines GL1 to GLn. The data signals are analog voltages corresponding to grayscale values (or gray levels) of the image data.

The display panel DP includes the gate lines GL1 to GLn, the light emitting lines EL1 to ELn, the data lines DL1 to DLm, and a plurality of pixels PX. The gate lines GL1 to GLn extend in a first direction DR1 and are arranged along a second direction DR2 substantially perpendicular to the first direction DR1. Each of the light emitting lines EL1 to ELn is disposed (e.g., located) to be substantially parallel to a corresponding gate line of the gate lines GL1 to GLn. The data lines DL1 to DLm are insulated from the gate lines GL1 to GLn while crossing the gate lines GL1 to GLn.

Each of the pixels PX is connected to a corresponding gate line of the gate lines GL1 to GLn, a corresponding light emitting line of the light emitting lines EL1 to ELn, and a corresponding data line of the data lines DL1 to DLm. According to an embodiment, each of the pixels PX may be connected to plural gate lines of the gate lines GL1 to GLn.

Figure 2:
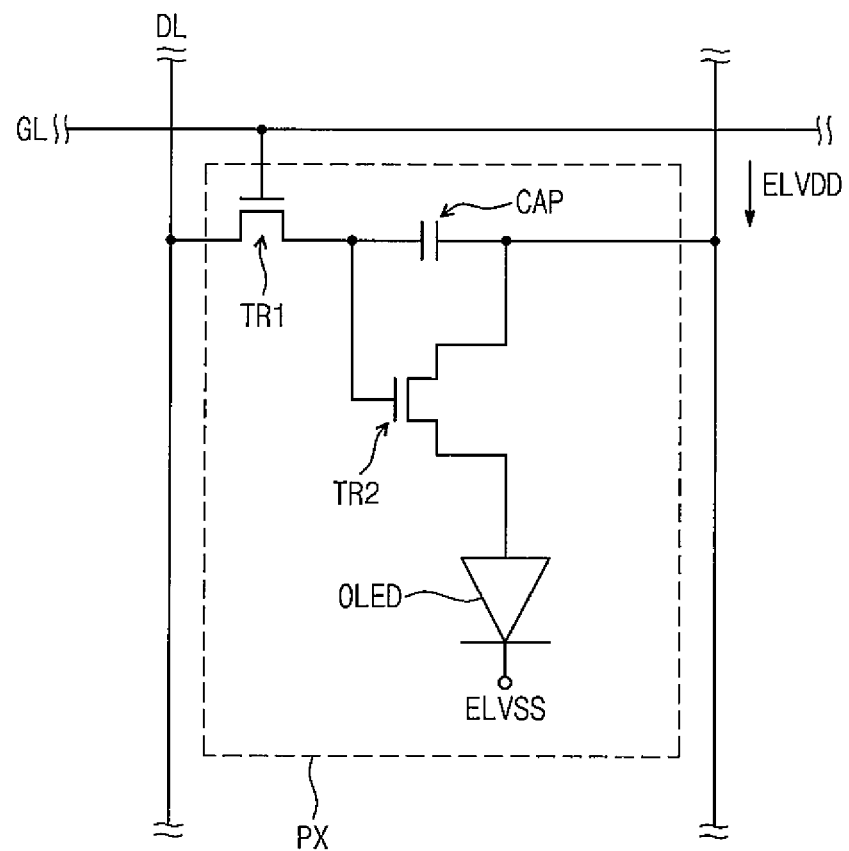
FIG. 2 is an equivalent circuit diagram showing a pixel of an organic light emitting display panel according to an exemplary embodiment of the present disclosure.

FIG. 2 is an equivalent circuit diagram showing a pixel of an organic light emitting display panel according to an exemplary embodiment of the present disclosure;

Referring to FIG. 2, each pixel PX includes an organic light emitting device OLED and a circuit part to control the organic light emitting device OLED. The circuit part includes a first transistor TR1, a second transistor TR2, and a capacitor CAP. The equivalent circuit of the pixel PX should not be limited to the circuit diagram shown in FIG. 2.

The first transistor TR1 includes a first control electrode connected to the gate line GL, a first source electrode connected to the data line DL, and a first drain electrode. The first transistor TR1 outputs the data signal applied to the data line DL in response to the gate signal applied to the gate line GL.

The second transistor TR2 includes a second control electrode connected to an output electrode of the first transistor TR1, a second source electrode applied with a first source voltage ELVDD, and a second drain electrode. The second control electrode includes a first gate electrode and a second gate electrode. The second drain electrode of the second transistor TR2 is connected to the organic light emitting device OLED.

The first and second gate electrodes included in the second control electrode control the second transistor TR2. The first and second gate electrodes define the capacitor CAP charged with the voltage corresponding to the data signal provided from the first transistor TR1. The first gate electrode defines one electrode of the capacitor CAP and the second gate electrode defines the other electrode of the capacitor CAP. Electric charges are stored between the first and second gate electrodes to allow the capacitor CAP to serve as a capacitor.

The second transistor TR2 controls a driving current flowing through the organic light emitting device OLED to correspond to the voltage charged in the capacitor CAP.

Figure 3:
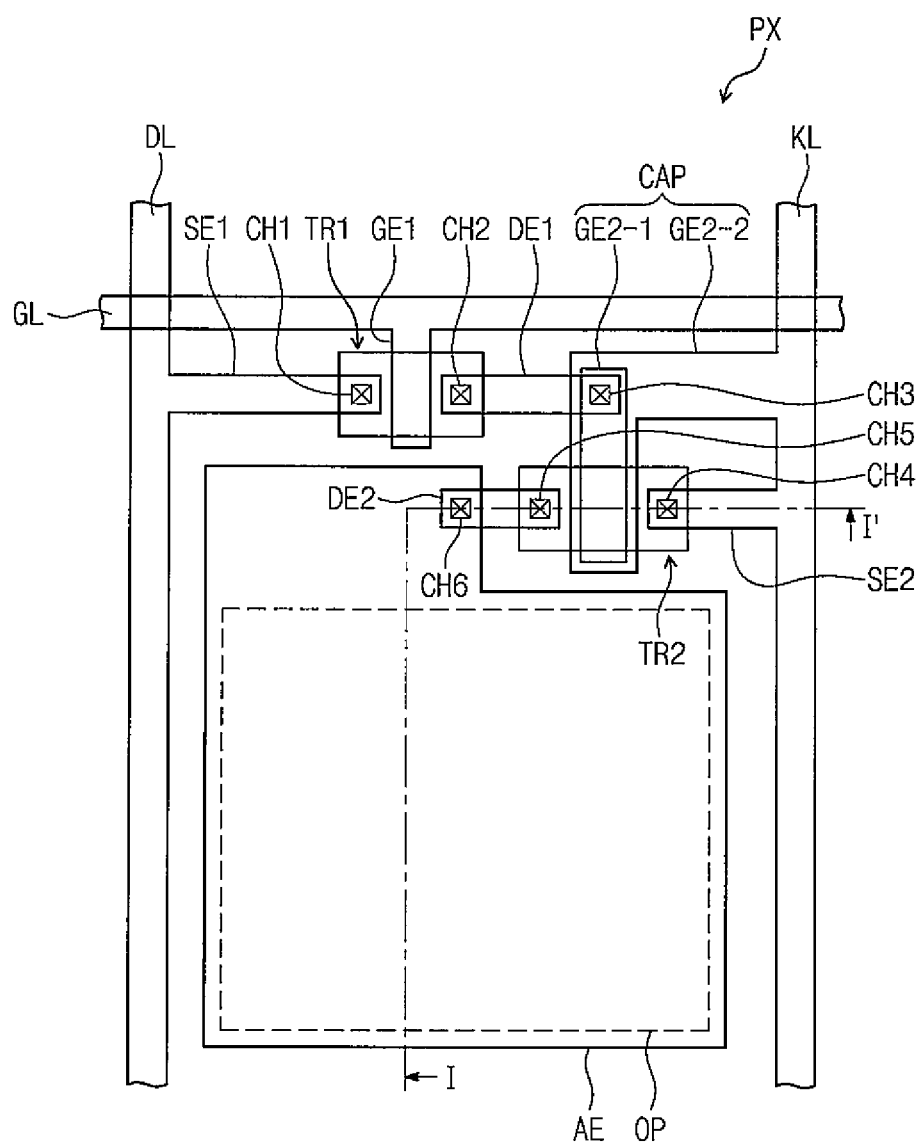
FIG. 3 is a layout diagram showing a pixel according to an exemplary embodiment of the present disclosure.
Figure 4:
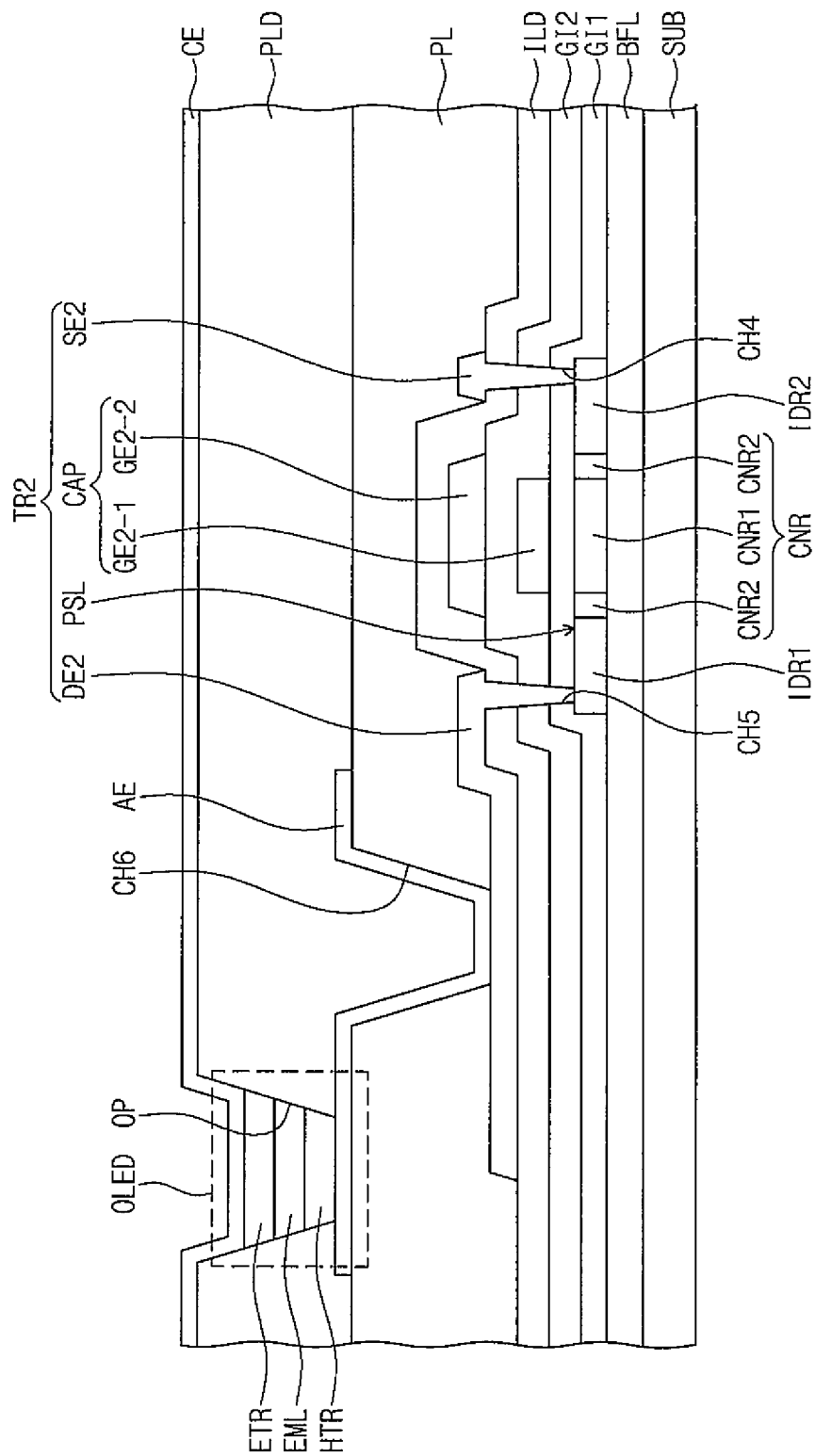
FIG. 4 is a cross-sectional view taken along the line I-I' of FIG. 3.

FIG. 3 is a layout diagram showing a pixel according to an exemplary embodiment of the present disclosure. FIG. 4 is a cross-sectional view taken along the line I-I' of FIG. 3. Hereinafter, the organic light emitting display panel will be described in further detail with reference to FIGS. 3 and 4.

Referring to FIGS. 3 and 4, the organic light emitting display panel DP includes a base substrate SUB, a buffer layer BFL, the signal lines GL and DL, and the pixels PX. The configurations of the base substrate SUB, the buffer layer BFL, the signal lines GL and DL, and the pixels PX may be changed depending on a kind of the organic light emitting display panel DP.

The buffer layer BFL is disposed on one surface of the base substrate SUB.

The buffer layer BFL prevents or substantially prevents impurities existing in the base substrate SUB from entering into the pixel PX during a manufacturing process of the organic light emitting display panel DP. In particular, the buffer layer BFL prevents or substantially prevents the impurities from entering into a polysilicon layer PSL of the pixel PX. The impurities inflow from an external source or are generated when the base substrate SUB is thermally decomposed. The impurities may be gas or sodium discharged from the base substrate SUB.

The signal lines GL and DL and the pixel PX are disposed on the buffer layer BFL. The polysilicon layer PSL of the second transistor TR2 is disposed on the buffer layer BFL. The polysilicon layer PSL may include a metal oxide semiconductor. However, substances that are included in the polysilicon layer PSL are not limited thereto, and may include any other suitable substances.

The polysilicon layer PSL includes a channel region CNR through which electrons or holes move, a first ion doping region IDR1, and a second ion doping region IDR2 disposed such that the channel region CNR is disposed between the first and second ion doping regions IDR1 and IDR2.

The polysilicon layer PSL includes grains that form a crystalline structure. As the size of the grains become large, the number of the grains included in the channel region CNR is reduced. When the number of the grains included in the channel region CNR is reduced, the number of boundary surfaces between the grains, which cause deterioration of the movement of the electrons and holes, is also reduced. Accordingly, a driving speed of the second transistor TR2 increases (e.g., becomes faster).

A first gate insulating layer GI1 is disposed on the buffer layer BFL to cover the polysilicon layer PSL. The first gate insulating layer GI1 includes an organic layer and/or an inorganic layer. Particularly, the first gate insulating layer GI1 may include a plurality of inorganic thin layers. The plurality of inorganic thin layers may include a silicon nitride layer and a silicon oxide layer.

The first gate electrode GE2-1 is disposed on the first gate insulating layer GI1. The first gate electrode GE2-1 includes a conductive material such as a metal.

A second gate insulating layer GI2 is disposed on the first gate insulating layer GI1 to cover the first gate electrode GE2-1. The second gate insulating layer GI2 includes the same material as that of the first gate insulating layer GI1. The second gate insulating layer GI2 has a thickness greater than a thickness of the first gate insulating layer GI1.

The second gate electrode GE2-2 is disposed on the second gate insulating layer GI2. The second gate electrode GE2-2 includes a conductive material such as a metal material.

The gate line GL and the first control electrode GE1 are disposed on the second gate insulating layer GI2.

An inter-insulating layer ILD is disposed on the second gate insulating layer GI2 to cover the first control electrode GE1 and the second gate electrode GE2-2. The inter-insulating layer ILD includes an organic layer and/or an inorganic layer. Particularly, the inter-insulating layer ILD may include a plurality of inorganic thin layers. The plurality of inorganic thin layers may include a silicon nitride layer and a silicon oxide layer.

The data line DL and a source voltage line KL are disposed on the inter-insulating layer ILD. The first source electrode SE1 and the first drain electrode DE1 of the first transistor TR1 are disposed on the inter-insulating layer ILD. The second source electrode SE2 and the second drain electrode DE2 of the second transistor TR2 are disposed on the inter-insulating layer ILD. The first source electrode SE1 is branched from the data line DL. The second source electrode SE2 is branched from the source voltage line KL.

The first source electrode SE1 and the first drain electrode DE1 are connected to the polysilicon layer of the first transistor TR1 respectively through first and second thru-holes (e.g., first and second through holes or openings) CH1 and CH2 formed through the first gate insulating layer GI1, the second gate insulating layer GI2, and the inter-insulating layer ILD. The first drain electrode DE1 is connected to the first gate electrode GE2-1 through a third thru-hole (e.g., third through hole or openings) CH3 formed through the inter-insulating layer ILD. The second source electrode SE2 and the second drain electrode DE2 are connected to the polysilicon layer PSL respectively through fourth and fifth thru-holes (e.g., fourth and fifth through holes or openings) CH4 and CH5 formed through the first gate insulating layer GI1, the second gate insulating layer GI2, and the inter-insulating layer ILD.

When viewed from above the inter-insulating layer ILD, the second gate electrode GE2-2 completely covers the first gate electrode GE2-1. Therefore, the second gate electrode GE2-2 has an area greater than an area of the first gate electrode GE2-1. In addition, the second gate electrode GE2-2 is disposed to overlap with the first gate electrode GE2-1 when viewed from above the inter-insulating layer ILD.

The arrangement of the first and second gate electrodes GE2-1 and GE2-2 exert influence on the size of the grains that form the crystalline structure of the polysilicon layer PSL. An average size of the grains included in the channel region CNR is greater than an average size of the grains included in the first and second ion doping regions IDR1 and IDR2. The channel region CNR includes a first channel region CNR1 overlapped with the first and second gate electrodes GE2-1 and GE2-2 and a second channel region CNR2 overlapped with the second gate electrode GE2-2 and not overlapped with the first gate electrode GE2-1. The average size of the grains included in the first channel region CNR1 is greater than an average size of the grains included in the second channel region CNR2. That is, the average size of the grains is reduced (e.g., becomes smaller) as a distance from a center portion of the polysilicon layer PSL increases and a distance from an edge of the polysilicon layer PSL is reduced. An average diameter of the grains in the center portion of the polysilicon layer PSL is in a range from about 30 micrometers to about 40 micrometers. The average diameter of the grains in the edge of the polysilicon layer PSL is in a range from about 10 micrometers to about 20 micrometers.

The first and second gate electrodes GE2-1 and GE2-2 serve as the capacitor CAP shown in FIG. 2. Thus, a separate area for the capacitor is not required. As a result, an opening portion OP becomes large (e.g., wide) due to the above-mentioned structure, and thus the light emitting efficiency of the organic light emitting device OLED is improved.

A passivation layer PL is disposed on the inter-insulating layer ILD to cover the first source electrode SE1, the first drain electrode DE1, the second source electrode SE2, and the second drain electrode DE2. The passivation layer PL includes an organic layer and/or an inorganic layer. In particular, the passivation layer PL may include an organic material to provide a plane surface.

A pixel definition layer PDL and the organic light emitting device OLED are disposed on the passivation layer PL. The organic light emitting device OLED includes an anode AE, a hole transport region HTR, an organic light emitting layer EML, an electron transport region ETR, and a cathode CE, which are sequentially stacked one on another. The anode AE is connected to the second drain electrode DE2 through a sixth thru-hole (e.g., sixth through hole or opening) CH6 formed through the passivation layer PL. The stacking order of the above-mentioned elements included in the organic light emitting device OLED should not be limited thereby or thereto.

The anode AE is disposed on the passivation layer PL and exposed through the opening portion OP of the pixel definition layer PDL. The hole transport region HTR is disposed on the anode AE and includes a hole injection layer. The hole transport region HTR may further include a hole transport layer.

The organic light emitting layer EML is disposed on the hole transport region HTR to correspond to the opening portion OP. The electron transport region ETR is disposed on the organic light emitting layer EML and includes an electron injection layer. The electron transport region ETR may further include an electron transport layer. The cathode CE is disposed on the electron transport region ETR. The cathode CE is disposed on the entire area of the base substrate SUB.

A protective film may be disposed on the other surface of the base substrate SUB, which faces (e.g., is opposite to) the surface on which the buffer layer BFL is disposed.

Figure 5:
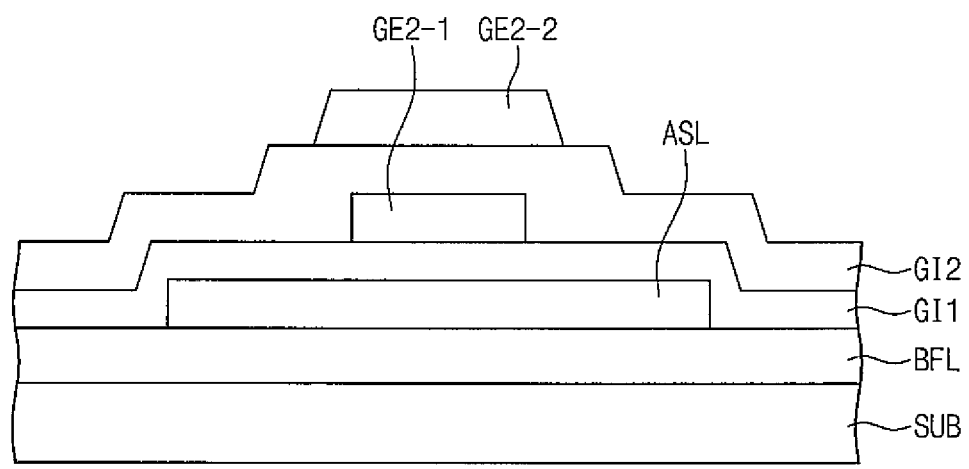
FIG. 5 is a cross-sectional view showing a portion of a process of manufacturing a transistor according to an exemplary embodiment of the present disclosure.
Figure 6A:
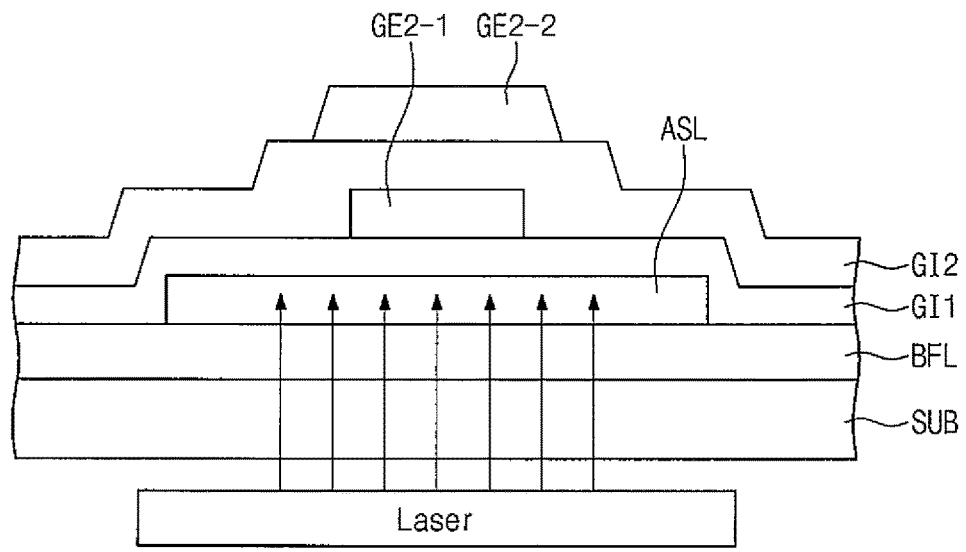
FIGS. 6A to 6C are cross-sectional views showing an annealing process according to an exemplary embodiment of the present disclosure.
Figure 6B:
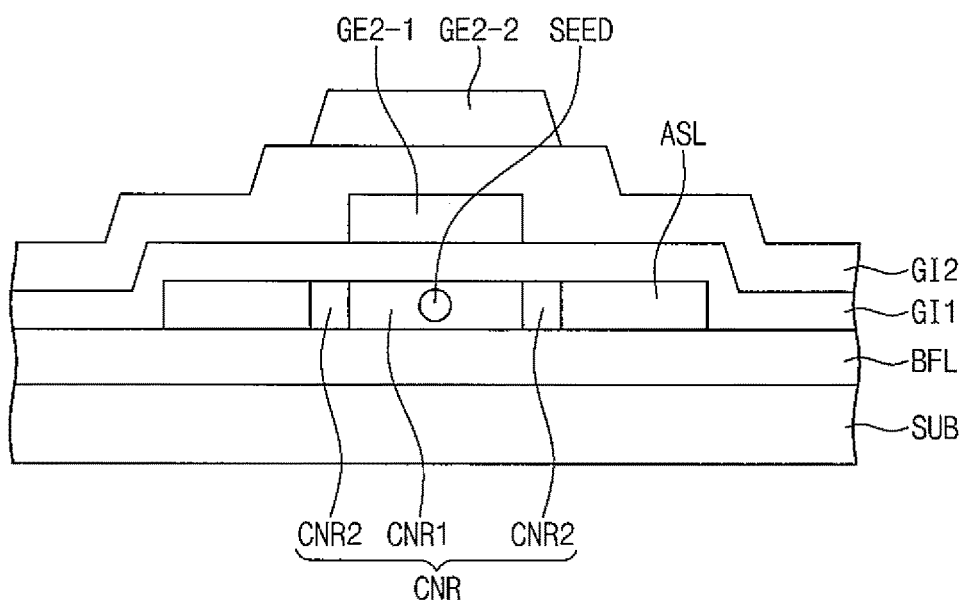
Figure 6C:
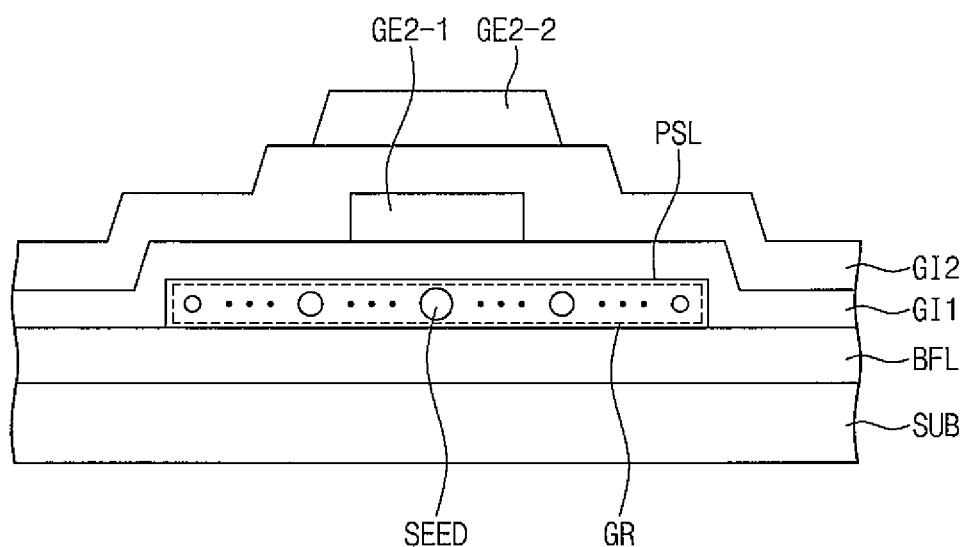
Figure 7:
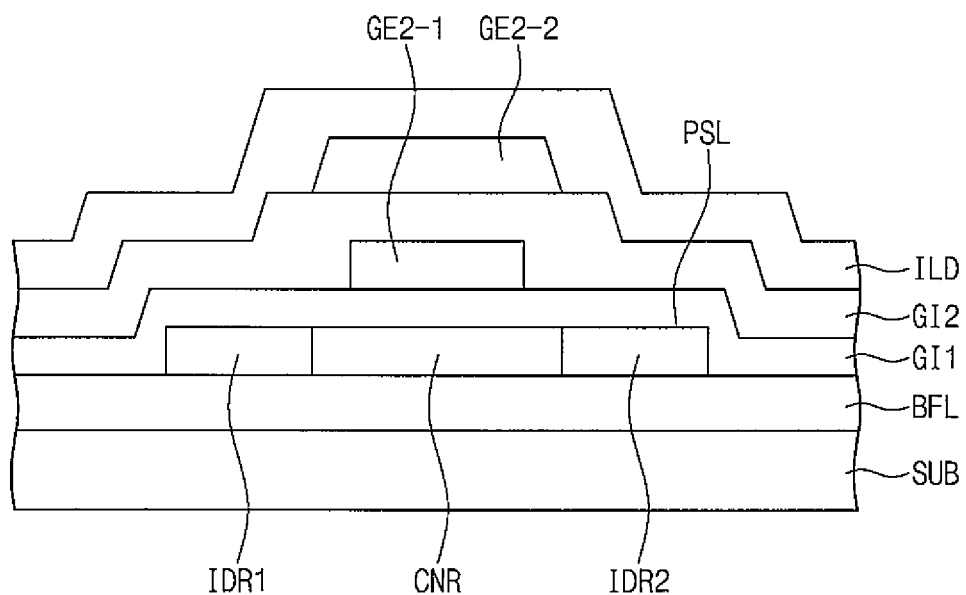
FIG. 7 is a cross-sectional view showing an ion-doping process and a process of forming an intermediate insulating layer according to an exemplary embodiment of the present disclosure.
Figure 8:
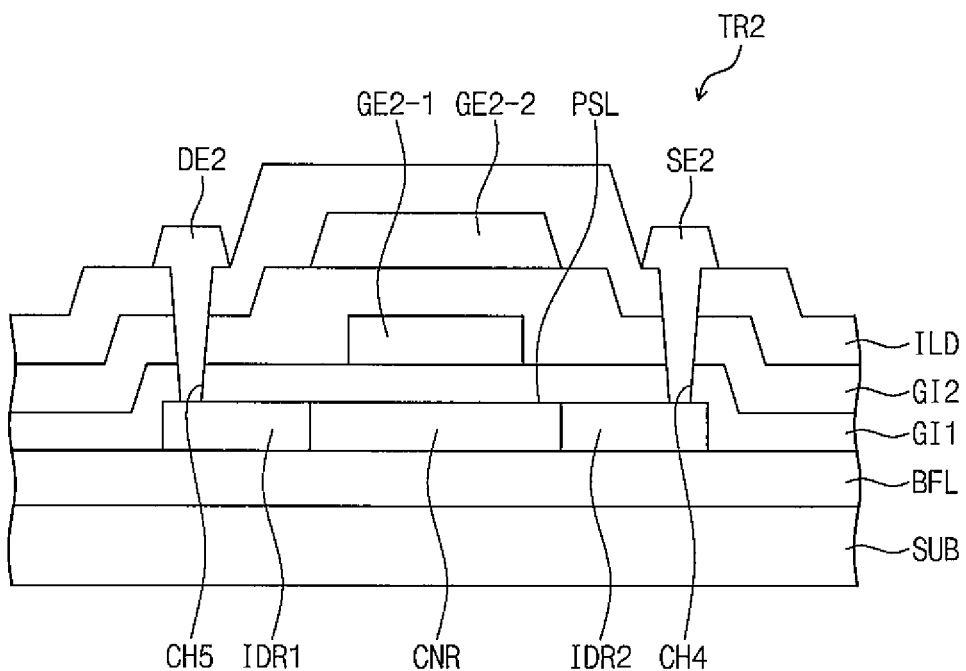
FIG. 8 is a cross-sectional view showing a transistor according to an exemplary embodiment of the present disclosure.
Figure 9:
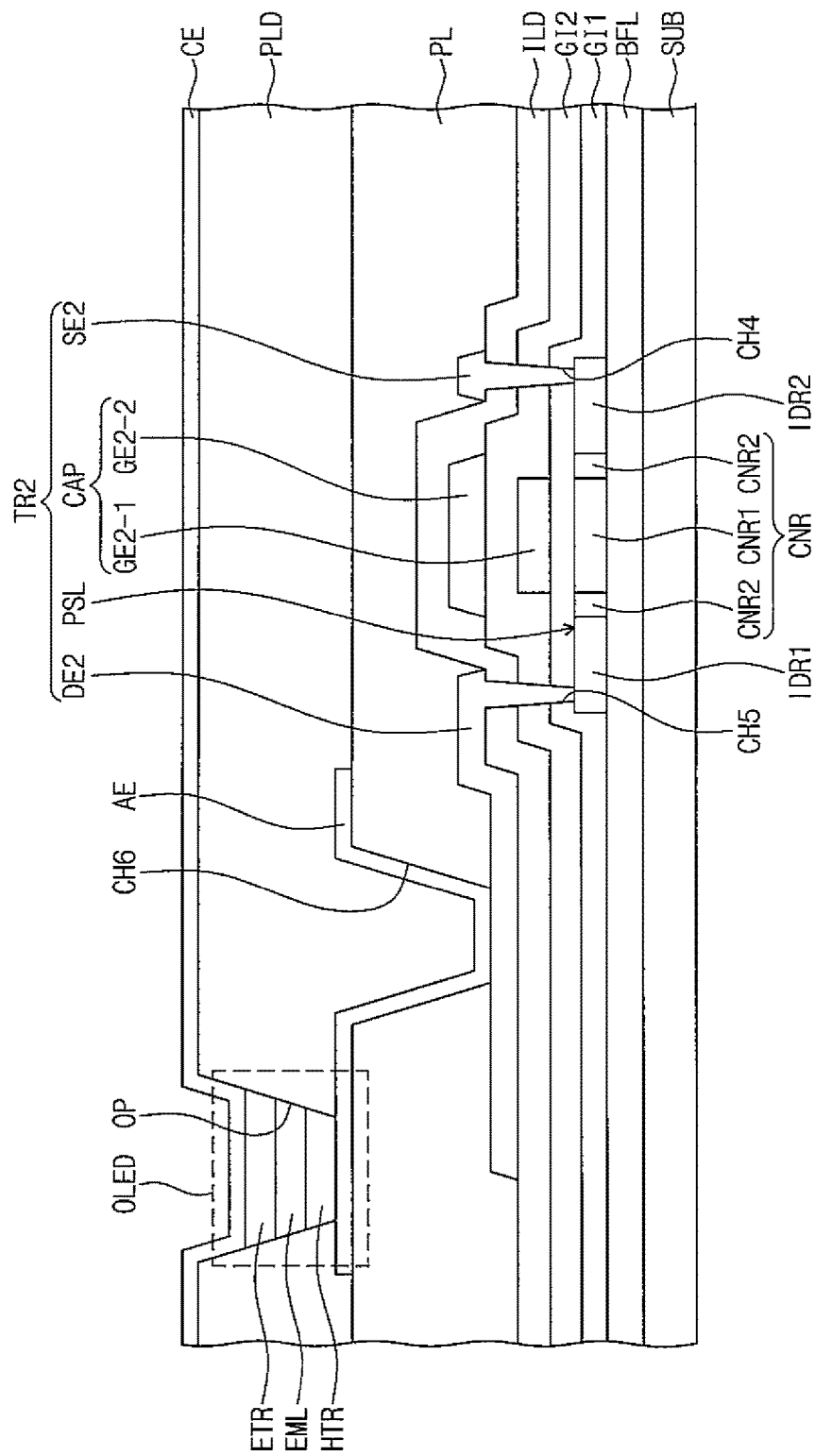
FIG. 9 is a cross-sectional view showing an organic light emitting device and a transistor according to an exemplary embodiment of the present disclosure.

FIG. 5 is a cross-sectional view showing a portion of a process of manufacturing a transistor according to an exemplary embodiment of the present disclosure. FIGS. 6A to 6C are cross-sectional views showing an annealing process according to an exemplary embodiment of the present disclosure. FIG. 7 is a cross-sectional view showing an ion-doping process and a process of forming an intermediate insulating layer according to an exemplary embodiment of the present disclosure. FIG. 8 is a cross-sectional view showing a transistor according to an exemplary embodiment of the present disclosure. FIG. 9 is a cross-sectional view showing an organic light emitting device and a transistor according to an exemplary embodiment of the present disclosure. Hereinafter, the method of manufacturing the second transistor TR2 and the organic light emitting device OLED connected to the second transistor TR2 will be described in further detail with reference to FIGS. 5 to 9.

Referring to FIG. 5, the buffer layer BFL is formed on the one surface of the base substrate SUB. The buffer layer BFL performs the function as described with reference to FIGS. 3 and 4.

An amorphous silicon layer ASL is formed on the buffer layer BFL. The amorphous silicon layer ASL does not have the crystalline structure and includes atoms irregularly arranged. That is, the amorphous silicon layer ASL exists in a thermodynamically non-equilibrium system.

The first gate insulating layer GI1 is formed on the buffer layer BFL to cover the amorphous silicon layer ASL. The first gate insulating layer GI1 includes the materials described with reference to FIGS. 3 and 4.

The first gate electrode GE2-1 is formed on the first gate insulating layer GI1.

The second gate insulating layer GI2 is formed on the first gate insulating layer GI2 to cover the first gate electrode GE2-1. The material and the thickness of the second gate insulating layer GI2 are the same or substantially the same as described with reference to FIGS. 3 and 4.

The second gate electrode GE2-2 is formed on the second gate insulating layer GI2. When viewed from above the second gate electrode GE2-2, the second gate electrode GE2-2 is formed to completely cover the first gate electrode GE2-1. That is, an area of the second gate electrode GE2-2 is larger than an area of the first gate electrode GE2-1. Also when viewed from above the second gate electrode GE2-2, the second gate electrode GE2-2 is formed to overlap with the first gate electrode GE2-1. The first and second gate electrodes GE2-1 and GE2-2 define the capacitor CAP in which the electric charges are stored.

FIGS. 6A to 6C are cross-sectional views showing processes of forming the polysilicon layer PSL from the amorphous silicon layer ASL of the substrate shown in FIG. 5 through the annealing process.

Referring to FIG. 6A, a laser is irradiated to the amorphous silicon layer ASL from a lower portion of the base substrate SUB shown in FIG. 5. The laser may be, but is not limited to, an excimer laser. The excimer laser is a gas laser using molecules, such as ArF, KrF, XeCl, etc., which are called excimer lasers, and has a short wavelength and a high power.

The amorphous silicon layer ASL irradiated with the laser is melted while a temperature of the amorphous silicon layer ASL increases.

Referring to FIG. 6B, the temperature of the amorphous silicon layer ASL drops after the irradiation of the laser is finished.

The first and second gate electrodes GE2-1 and GE2-2 include the metal material having high heat conductivity. Accordingly, the heat conductivity of the first and second gate electrodes GE2-1 and GE2-2 is greater than that of the first and second gate insulating layers GI1 and GI2, which do not include the metal material.

As the temperature of the amorphous silicon layer ASL drops, the temperature of the first channel region CNR1, which is overlapped with the first and second gate electrodes GE2-1 and GE2-2, drops faster than the other areas due to the first and second gate electrodes GE2-1 and GE2-2.

Therefore, a seed that serves as a starting point of forming the crystalline structure is formed in the first channel region CNR1 of the amorphous silicon layer ASL in which the temperature drops faster than the other areas.

Referring to FIG. 6C, the crystalline structure is formed from the seed formed in the first channel region CNR1 of the amorphous silicon layer ASL toward the edge of the amorphous silicon layer ASL. This is referred to as a horizontal growth of crystal. The temperature of the amorphous silicon layer ASL is relatively slowly decreased in the second channel region CNR2 (refer to FIG. 6B), which is overlapped with only the second gate electrode GE2-2 and not overlapped with the first gate electrode GE2-1, as compared to that of the first channel region CNR1. In an area of the amorphous silicon layer ASL, which is not overlapped with the first and second gate electrodes GE2-1 and GE2-2, the temperature of the amorphous silicon layer ASL is slowly decreased compared to that of the first channel region CNR1 or the second channel region CNR2. As the temperature drops, the crystalline structure is gradually formed.

When the crystalline structure of the amorphous silicon layer ASL is completed, the polysilicon layer PSL having a polycrystalline structure with the grains is formed. Due to the difference in variation of the temperature between the regions of the amorphous silicon layer ASL, the average size of the grains of the polysilicon layer PSL is reduced (e.g., becomes smaller) as a distance from the first channel region CNR1 increases. That is, the size of the grains is decreased from the center portion of the polysilicon layer PSL as it goes to the edge of the polysilicon layer PSL.

Referring to FIG. 7, the polysilicon layer PSL is ion-doped using the second gate electrode GE2-2 as a mask. The first and second ion doping regions IDR1 and IDR2, which are disposed such that the channel region CNR is disposed between the first and second ion doping regions IDR1 and IDR2, are formed through the ion-doping process. When the ion doping process is performed using the second gate electrode GE2-2 as the mask without using a separate mask, the manufacturing process of the transistor is simplified and efficiency of the manufacturing process is improved (e.g. increased).

After the first and second ion doping regions IDR1 and IDR2 are formed, the inter-insulating layer ILD is formed. The structure and the material of the inter-insulating layer are the same or substantially the same as described with reference to FIGS. 3 and 4.

According to an embodiment, the process of forming the inter-insulating layer ILD may be performed prior to the ion-doping process of forming the first and second ion doping regions IDR1 and IDR2 and.

Referring to FIG. 8, the second drain electrode DE2 and the second source electrode SE2 are formed. The second drain electrode DE2 is formed on the inter-insulating layer ILD and connected to the first ion doping region IDR1 through the fifth thru-hole CH5. The second source electrode SE2 is formed on the inter-insulating layer ILD and connected to the second ion doping region IDR2 through the fourth thru-hole CH4.

Referring to FIG. 9 the organic light emitting device OLED connected to the second drain electrode DE2 of the second transistor TR2 is formed.

The passivation layer PL is formed on the inter-insulating layer ILD to cover the second source electrode SE2 and the second drain electrode DE2. The material of the passivation layer PL is as described with reference to FIGS. 3 and 4.

The sixth thru-hole CH6 is formed through the passivation layer PL to expose the second drain electrode DE2. The anode AE is formed on the passivation layer PL to be connected to the second drain electrode DE2 through the sixth thru-hole CH6.

The hole transport region HTR, the organic light emitting layer EML, the electron transport region ETR, and the cathode CE are sequentially stacked on the anode AE to form the organic light emitting device OLED. The stacking order of the elements included in the organic fight emitting device OLED and the structure of the organic light emitting device OLED are the same or substantially the same as described with reference to FIGS. 3 and 4.

The manufacturing process of the organic fight emitting display may be simplified by the manufacturing method of the transistor, and thus the efficiency of the manufacturing process of the organic light emitting display may be improved. In addition, the average size of the grains of the polysilicon layer PSL may be increased and the driving time of the transistor may be reduced (e.g., become fast).

Although the exemplary embodiments of the present invention have been described, it is understood that the present invention should not be limited to these exemplary embodiments, but various changes and modifications can be made by one ordinary skilled in the art within the spirit and scope of the present invention as defined by the following claims, and equivalents thereof.

What is claimed is:

1. A transistor comprising:
   a polysilicon layer on a base substrate and comprising a channel region, a first ion doping region, a second ion doping region, the channel region being between the first and second ion doping regions, an average size of grains in the channel region being greater than that of those in the first and second ion doping regions;
   a first gate electrode insulated from and overlapping the channel region;
   a second gate electrode insulated from the first gate electrode and overlapping the channel region;
   an inter-insulating layer on the second gate electrode;
   a source electrode on the inter-insulating layer and connected to the first ion doping region; and
   a drain electrode on the inter-insulating layer and connected to the second ion doping region,
   wherein the channel region comprises a first channel region overlapping the first and second gate electrodes, and a second channel region overlapping the second gate electrode and not overlapped with the first gate electrode, and wherein an average size of corresponding ones of the grains in the first channel region is greater than that of corresponding ones of the grains in the second channel region.

2. The transistor of claim 1, wherein the grains have an average diameter in a range from about 30 micrometers to about 40 micrometers in a center portion of the polysilicon layer and have an average diameter in a range from about 10 micrometers to about 20 micrometers in an edge portion of the polysilicon layer.

3. The transistor of claim 1, wherein the second gate electrode completely covers the first gate electrode when viewed from above the inter-insulating layer.

4. The transistor of claim 3, wherein the first and second gate electrodes define a capacitor charged with electric charges.

5. The transistor of claim 4, further comprising:
a first gate insulating layer between the polysilicon layer and the first gate electrode; and
a second gate insulating layer between the first gate electrode and the second gate electrode, wherein the first gate insulating layer has a thickness less than a thickness of the second gate insulating layer.

6. The transistor of claim 5, further comprising a buffer layer between the base substrate and the polysilicon layer.

7. An organic light emitting display comprising:
a scan driver configured to apply gate signals to gate lines and to apply light emitting control signals to light emitting lines;
a data driver configured to apply data signals to data lines; and
an organic light emitting display panel comprising a plurality of pixels, each of the pixels comprising an organic light emitting device and a circuit part configured to control the organic light emitting device, the circuit part comprising a first transistor and a second transistor, the first transistor being configured to output a corresponding data signal applied to a corresponding data line of the data lines in response to a corresponding gate signal applied to a corresponding gate line of the gate lines, and the second transistor being configured to control a driving current flowing through the organic light emitting device, the second transistor comprising:
a polysilicon layer on a base substrate and comprising a channel region, a first ion doping region, a second ion doping region, the channel region is between the first and second ion doping regions, an average size of grains in the channel region being greater than that of those in the first and second ion doping regions;
a first gate electrode insulated from and overlapping the channel region;
a second gate electrode insulated from the first gate electrode and overlapping the channel region;
an inter-insulating layer on the second gate electrode;
a source electrode on the inter-insulating layer and connected to the first ion doping region; and
a drain electrode on the inter-insulating layer and connected to the second ion doping region,
wherein the grains have an average diameter in a range from about 30 micrometers to about 40 micrometers in a center portion of the polysilicon layer and have an average diameter in a range from about 10 micrometers to about 20 micrometers in an edge portion of the polysilicon layer.

8. The organic light emitting display of claim 7, wherein the second gate electrode completely covers the first gate electrode when viewed from above the inter-insulating layer.

9. The organic light emitting display of claim 8, wherein the first and second gate electrodes define a capacitor charged with a voltage corresponding to the data signal provided from the first transistor.

10. The organic light emitting display of claim 9, further comprising a buffer layer between the base substrate and the polysilicon layer.

11. A transistor comprising:
a polysilicon layer on a base substrate and comprising a channel region, a first ion doping region, a second ion doping region, the channel region being between the first and second ion doping regions, an average size of grains in the channel region being greater than that of those in the first and second ion doping regions;
a first gate electrode insulated from and overlapping the channel region;
a second gate electrode insulated from the first gate electrode and overlapping the channel region;
an inter-insulating layer on the second gate electrode;
a source electrode on the inter-insulating layer and connected to the first ion doping region; and
a drain electrode on the inter-insulating layer and connected to the second ion doping region,
wherein the grains have an average diameter in a range from about 30 micrometers to about 40 micrometers in a center portion of the polysilicon layer and have an average diameter in a range from about 10 micrometers to about 20 micrometers in an edge portion of the polysilicon layer.

* * * * *